(12) United States Patent
Melton

(10) Patent No.: US 7,487,287 B2
(45) Date of Patent: Feb. 3, 2009

(54) TIME EFFICIENT EMBEDDED EEPROM/PROCESSOR CONTROL METHOD

(75) Inventor: Randall W. Melton, Olney, MD (US)

(73) Assignee: Atmel Corporation, San Jose, CA (US)

( * ) Notice: Subject to any disclaimer, the term of this patent is extended or adjusted under 35 U.S.C. 154(b) by 284 days.

(21) Appl. No.: 11/349,561

(22) Filed: Feb. 8, 2006

(65) Prior Publication Data

US 2007/0186031 A1   Aug. 9, 2007

(51) Int. Cl.
  *G06F 12/00*  (2006.01)
  *G06F 13/00*  (2006.01)
(52) U.S. Cl. ............... 711/103; 711/100; 711/154; 365/189.011; 365/228
(58) Field of Classification Search ............ 711/103, 711/100, 154; 710/5, 8, 14; 365/189.011, 365/228, 189.01
  See application file for complete search history.

(56) References Cited

U.S. PATENT DOCUMENTS

| | | | |
|---|---|---|---|
| 4,974,208 A * | 11/1990 | Nakamura et al. | 365/228 |
| 5,548,741 A | 8/1996 | Watanabe | |
| 5,657,467 A | 8/1997 | Hasegawa | 395/430 |
| 6,459,640 B1 | 10/2002 | Tani et al. | 365/218 |
| 6,512,693 B2 | 1/2003 | Honda et al. | 365/185.13 |
| 6,839,774 B1 * | 1/2005 | Ahn et al. | 710/14 |
| 2001/0018724 A1 | 8/2001 | Sukegawa | |
| 2001/0054128 A1 | 12/2001 | Sezaki et al. | |
| 2003/0051094 A1 | 3/2003 | Katayama et al. | |
| 2004/0085819 A1 | 5/2004 | Hara et al. | 365/189.04 |
| 2004/0208064 A1 | 10/2004 | Sohn et al. | 365/189.04 |
| 2005/0268025 A1 | 12/2005 | Smith et al. | |

FOREIGN PATENT DOCUMENTS

WO   WO-2007/092659 A2   8/2007

OTHER PUBLICATIONS

"International Application No. PCT/US07/60551, International Search Report mailed Feb. 11, 2008", 3 pgs.
"International Application No. PCT/US07/60551, Written Opinion mailed Feb. 11, 2008", 4 pgs.

* cited by examiner

*Primary Examiner*—Tuan V. Thai
(74) *Attorney, Agent, or Firm*—Schwegman, Lundberg & Woessner, P.A.

(57) ABSTRACT

In an embedded system with a processor and an EEPROM that provides an EEPROM BUSY signal if the EEPROM is in a write mode, a block-before-write subroutine is used to hold the processor before a write operation to the EEPROM. A detector circuit finds read functions that are to be mapped into the EEPROM address space and suspends code execution if an EEPROM BUSY bit is asserted and the EEPROM is the read target. Code execution by the processor and processor access to memories other than the EEPROM is permitted while the EEPROM is being written. If any access is made by the processor to the EEPROM while the EEPROM BUSY bit is asserted, the processor enters a WAIT state to temporarily suspends execution of program code.

20 Claims, 5 Drawing Sheets

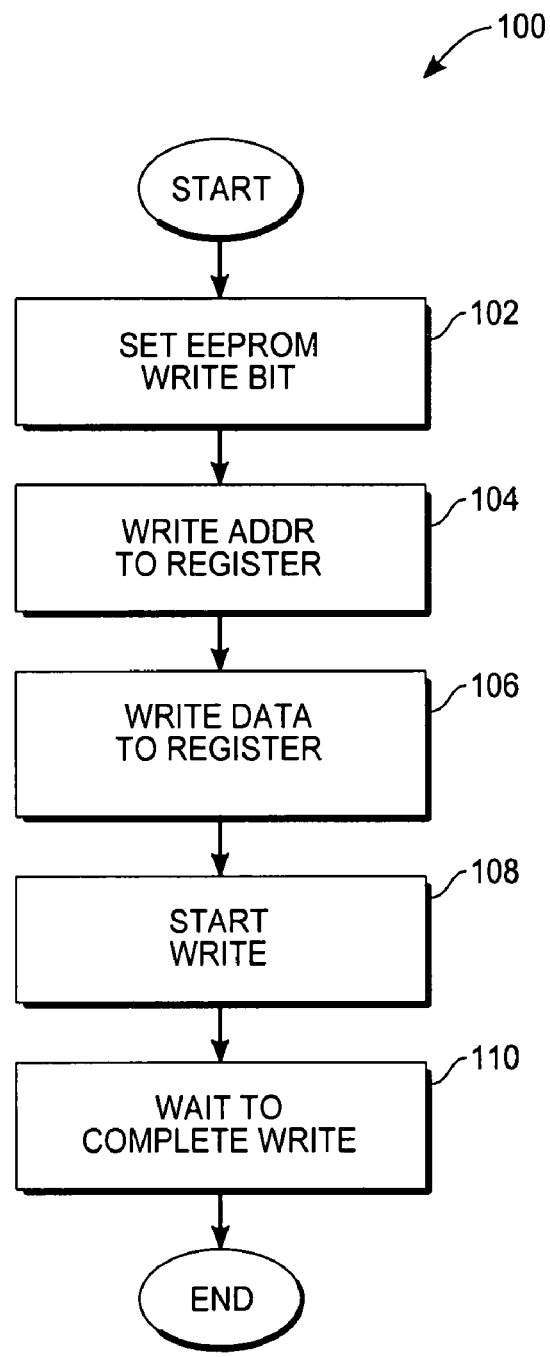
Fig._1
(Prior Art)

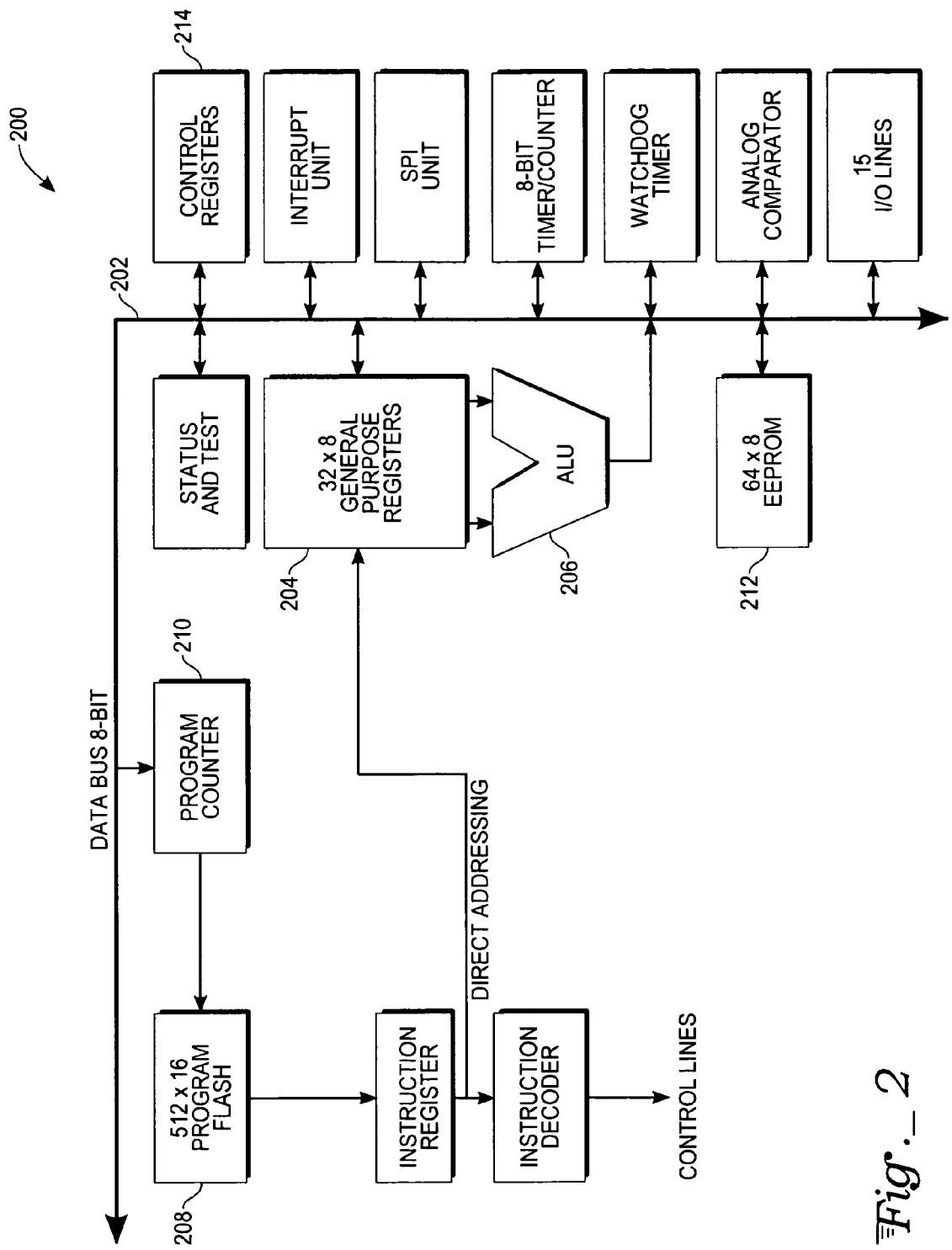
Fig. _2

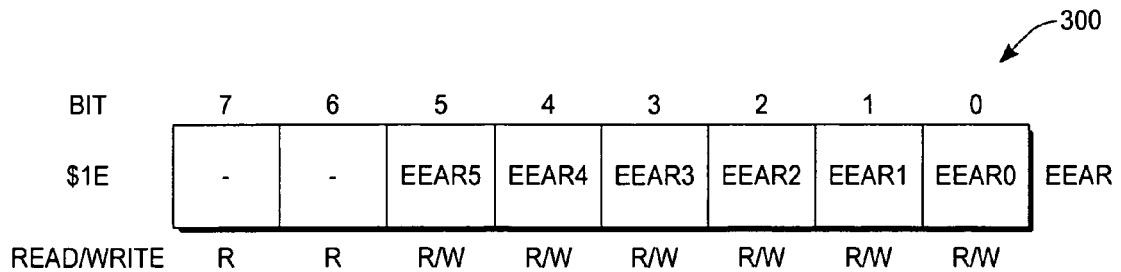
Fig._3A
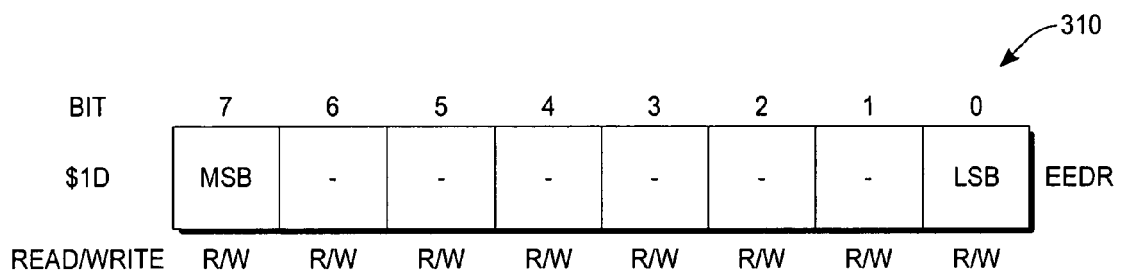
Fig._3B
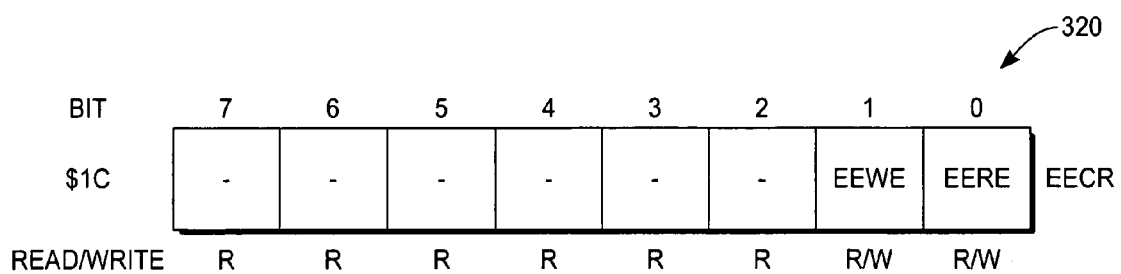
Fig._3C

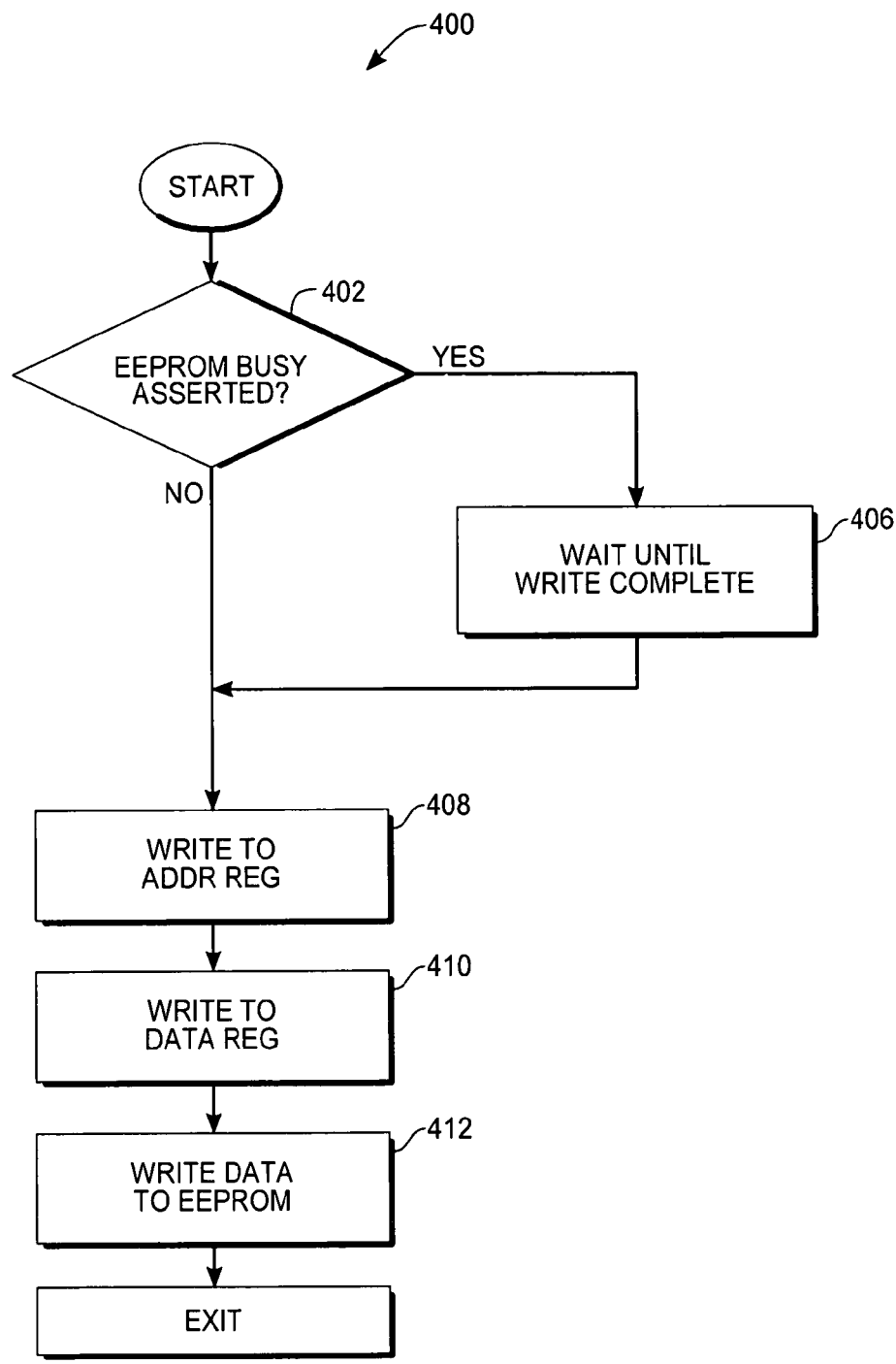
Fig._4

US 7,487,287 B2

TIME EFFICIENT EMBEDDED EEPROM/PROCESSOR CONTROL METHOD

TECHNICAL FIELD

The invention relates to an embedded system that includes an electrically erasable programmed read only memory (EEPROM) and an associated processor and, in particular, to improving the performance of an embedded system.

BACKGROUND ART

An embedded system is generally a specialized computer system that performs a special purpose and that may be a subsystem in a larger system. Often, an embedded system is provided on a single, inexpensive integrated circuit chip that includes a microcontroller or microprocessor and associated memory. The associated memory includes an EEPROM and other types of memories. A write operation for an EEPROM takes much greater time than a read operation for an EEPROM. A typical write time for an embedded EEPROM is several milliseconds, while a typical read time is 10 to 100 nanoseconds. As a consequence of the greater write time for an EEPROM, a typical processor that is associated with an EEPROM in an embedded system is required to stop and then wait a considerable amount of downtime for each write operation to the EEPROM.

A typical EEPROM write operation includes the following steps: a page buffer for the EEPROM is loaded with one or more bytes of data. A voltage on a control pin is changed to start the write operation by writing from the page buffer to the memory cells. Upon completion of the write operation, an EPROM BUSY bit is reset to indicate completion of the EEPROM write operation.

In a typical embedded EEPROM, the EEPROM is not available for read/write operations until the EEPROM BUSY bit is reset, or goes away. This results in the processor waiting (either by polling the EEPROM BUSY bit, or by an interrupt) until EEPROM BUSY bit is reset before continuing code execution. This is especially true in systems where code and data are stored in a single EEPROM. Requiring the processor to wait is very common in embedded systems where both program code and data are stored in a single EEPROM.

In an embedded system that has more than one type of memory, read/write operation can be optimized in such a way that the processor can continue to do useful work during the time that the EEPROM is in a write cycle. Such optimizations should make sure that, during the write operation, no EEPROM accesses will be needed by the computer. This requires that the computer does not fetch data from the EEPROM while EEPROM BUSY bit is asserted. In an embedded system, it can become complicated trying to make such an optimization.

Alternatively, a simpler block-after-write approach is often used to write data into an EEPROM and then to block operation of the microprocessor while the write operation to the EEPROM is being completed. An example of code for a block-after-write subroutine is shown below:

```
// example of block-after-write code
void eeWriteByte( uint16_t address, uint8_t data) {
    outb(IO_EECR, EEWRITE_FLAG;   // set the EEPROM write bit
                                   in the control register
    outw (IO_EEAR, address);       // write the address to the EE
                                   address register
```

-continued

```
    outb(IO_EEDR, data);           // write the data to the EE
                                   data register
    outb(IO_EECR, 0);              // drop the write control line
                                   starting the write
    while(inb(IO_EESTATUS) & EEBUSY_FLAG) {
        nop( ); //   wait until busy goes away
    }
}
```

FIG. 1 is a flowchart 100 for a block-after-write subroutine that blocks, or interrupts, operation of a computer after writing to an EEPROM. Block 102 shows that the block-after-write subroutine first sets the EEPROM WRITE bit in the control register. Block 104 shows that the subroutine then writes the designated EEPROM address to the EEPROM address register. Block 106 shows the subroutine then writes the data to the EEPROM data register. Block 106 shows that a WRITE CONTROL line is dropped to start writing the data from the EEPROM data register into the addressed EEPROM memory location. Block 110 indicates that the processor is blocked from operation by being in a wait state until the EEPROM write operation is complete and the EEPROM BUSY bit is deasserted.

At first thought you could move the blocking code to the beginning of the subroutine, but it has the result that any subsequent EEPROM reads would fail. Incorrect data would be read without any indication an error had occurred.

U.S. Patent Publication 2004/0208064 to Sohn et al. describes a method of controlling an IC memory that is capable of simultaneously performing a data read operation and a data write operation. However, this approach requires a memory with separate input and output pins and also uses a tag memory. Using additional hardware would not be cost effective in a embedded microcontroller system.

U.S. Pat. No. 5,657,467 to Hasegawa describes a non-volatile semiconductor memory device that includes a separate register for storing data. A selection circuit is supplied with a busy signal from a write control circuit, which indicates that the memory device is operating in a write mode and that an output signal from the separate register should be used. Having a separate register for storing data would not be cost effective in a embedded microcontroller system.

U.S. Pat. No. 6,512,693 to Honda et al. describes a memory cell array that is arranged into a number of cores, each of which includes a block of memory cells. A number of cores are selected as a first bank, while the remaining cores are selected as a second bank. This allows a data read operation to be carried on in one bank while a data write/erase operation is carried out in the second bank. Having a number of cores and block of memory would not be cost effective in an embedded microcontroller system What is needed is an efficient technique for effectively reducing downtime for a processor associated with an EEPROM in an inexpensive embedded system.

SUMMARY

Writing data into an EEPROM takes a significant amount of time. The present invention addresses the problem of a processor that is associated with an embedded EEPROM that is required to wait a considerable amount of downtime for each write operation into the EEPROM. The present invention is intended to effectively reduce downtime for the associated processor (reduces processor latency). The present invention is intended to assist an embedded processor to concurrently execute program code while an associated EEPROM is being written into.

The present invention uses a block-before-write subroutine to check and wait if the EEPROM is busy before a write operation to the EEPROM. The present invention also provides a circuit that detects reads that are intended to be mapped into the EEPROM address space and that suspends code execution if an EEPROM BUSY bit is asserted. As a consequence, the present invention allows program code execution by the associated processor and access to other memories, that is, to memories other than the EEPROM, even while the EEPROM is being written. If any access is made by the processor to the EEPROM, the processor enters a wait state and the processor temporarily suspends execution of program code until the EEPROM BUSY bit is deasserted.

This circuit in combination with the block-before-write code allows for program-code optimization without being concerned with unanticipated EEPROM accesses. The result is that program code execution by the computer continues until an EEPROM BUSY signal blocks operation of the processor. The present invention provides both a block-before-write function and a hardware read lockout. As a consequence, write operations to the EEPROM are blocked at the start of a write subroutine, while the read operations to the EEPROM are blocked by the additional circuit.

The present invention provides a time-efficient read/write control method for an embedded EEPROM and processor. The method includes providing an active EEPROM BUSY signal that is active, or asserted, when the EEPROM is engaged in a write activity. When an EEPROM BUSY signal is inactive, or deasserted, the method continues to execute program code in the processor. When the EEPROM BUSY signal is active, the method blocks write code execution at the start of a write subroutine. Also when the EEPROM BUSY signal is active, the method includes blocking read code execution by using a read detection circuit that detects when the EEPROM BUSY signal is active and when a read is requested for an EEPROM address. After the EEPROM BUSY signal is inactivated, or deasserted, the method includes continuing code execution by the processor until an EEPROM BUSY signal blocks code execution such that write operations are blocked at the start of a write subroutine while read operations are blocked by the read detection circuit.

The method includes detecting a read address that is mapped into the EEPROM address space. As long as the EEPROM is not accessed by the processor and the EEPROM BUSY signal is not asserted, program code execution is allowed.

The step of blocking write code execution at the start of a write subroutine when the EEPROM BUSY signal is active includes: detecting setting, or asserting, of an EEPROM BUSY in a control register; blocking code execution in the processor; waiting until the EEPROM BUSY bit is deasserted, or inactivated; writing an address to an EEPROM address register; writing data into an EEPROM data register; and toggling a write control line to start writing data into the EEPROM at the address EEPROM address register.

BRIEF DESCRIPTION OF THE DRAWINGS

FIG. 1 is a flow chart for a conventional block-after-write subroutine.

FIG. 2 is a block diagram of an exemplary microcontroller having a built-in EEPROM.

FIG. 3A shows an EEPROM address register for the microcontroller of FIG. 2.

FIG. 3B shows an EEPROM data register for the microcontroller of FIG. 2.

FIG. 3C shows an EEPROM control register for the microcontroller of FIG. 2.

FIG. 4 is a flow chart for a block-before-write subroutine.

DETAILED DESCRIPTION

Figure 5:
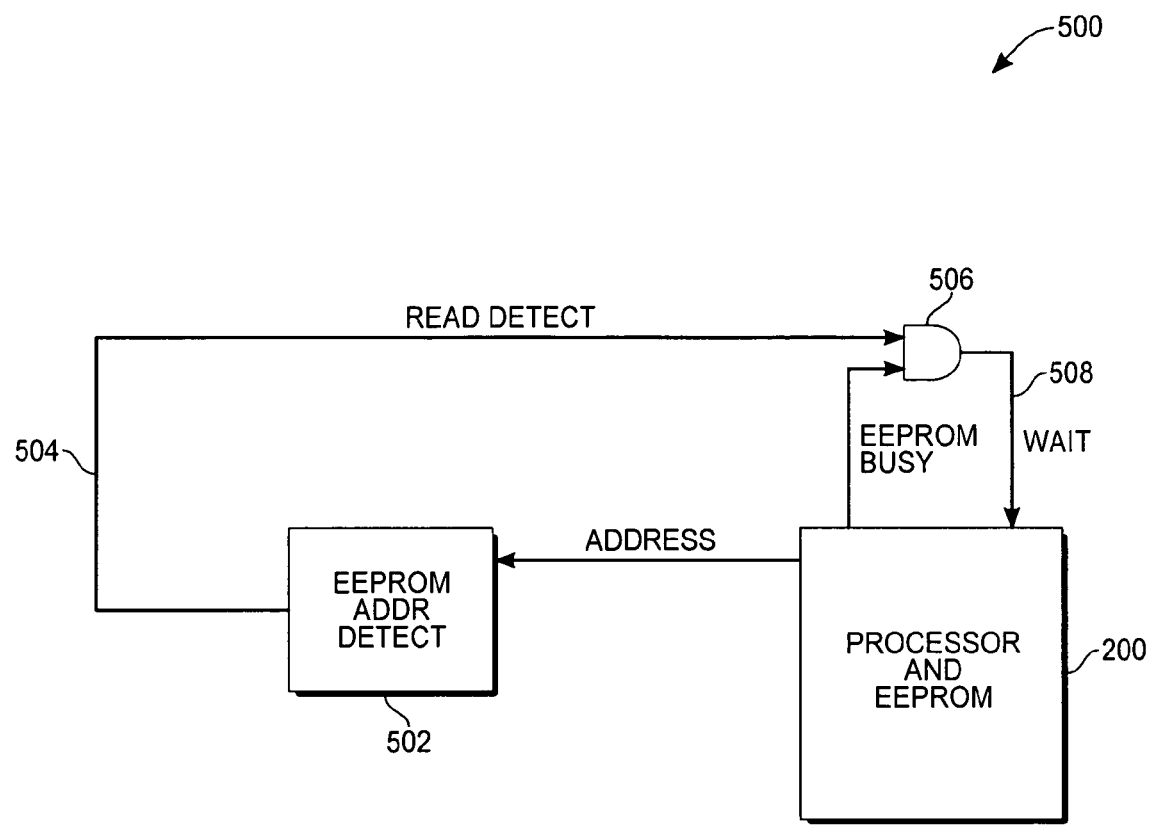
FIG. 5 is a circuit diagram for a read detector circuit.

FIG. 2 shows the architecture of an exemplary AT90S1200 RISC microcontroller 200 produced by ATMEL Corporation that has a built-in EEPROM. The microcontroller 200 uses a Harvard architecture concept with separate memories and with buses for program and data memories. An 8-bit data bus 202 is shown linking various internal components. 32×8 general purpose registers 204 provide two output operands to an arithmetic logic unit (ALU) 206. Program memory is provided as an in-system downloadable 512×16 programmable FLASH memory 208. During interrupts and subroutine calls, a return address program counter (PC) is stored in the stack, which is a 3-level deep hardware stack 210 dedicated for subroutines and interrupts.

This microcontroller contains 64 bytes of data in a 64×8 EEPROM memory 212 that is organized as a separate data space in which single bytes can be read and written. Access between the EEPROM and the CPU is controlled by EEPROM control registers 214 that are provided in an I/O space. Various I/O locations in the I/O space are accessed by IN and OUT instructions that transfer data between the 32 general working registers 204 and the I/O space. EEPROM write access time is in the range of 2.5 to 4 milliseconds. A self-timing function lets user software detect when the next byte can be written to the EEPROM. When the EEPROM is read or written, the CPU is halted for two clock cycles before the next instruction is executed.

FIG. 3A illustrates an 8-bit EEPROM address register (EEAR) 300 for the microcontroller 200. The EEAR 300 has an I/O space address of $1E. Bits 0-5 (EEAR0-EEAR5) specify the EEPROM addresses in the 64-byte EEPROM 212 space.

FIG. 3B illustrates an 8-bit EEPROM data register (EEDR) 310 for the microcontroller 200. The EEDR 310 has an I/O space address of $1D. Bits 0-7 (LSB-MSB) contain data for the EEPROM 212. For an EEPROM write operation, the EEDR register 310 contains the data to be written to the EEPROM 212 in an EEPROM address given by the EEAR register 300. For an EEPROM read operation, the EEDR register 310 contains the data read out from the EEEPROM 212 at the EEPROM address given by EEAR 300.

FIG. 3C illustrates an 8-bit EEPROM control register (EECR) 320 for the microcontroller 200. The EECR 320 has an I/O space address of $1C.

Bit 1 of the EECT 320 is an EEPROM Write Enable (EEWE) bit, which is the write strobe to the EEPROM 212. When the address and data are correctly set up, the EEWE bit is set to write into the EEPROM. When the write access time has elapsed, the EEWE bit is cleared, or reset to zero by hardware. User software can poll this bit and wait for a zero before writing the next byte. When EEWE has been set, the CPU is halted for two cycles before the next instruction is executed.

Bit 2 of the EECT 310 is an EEPROM Read Enable (EERE) bit, which is the read strobe to the EEPROM 212. When the correct address is set up in the EEAR 300, the EERE bit must be set. When the EERE bit is cleared, or reset to zero by hardware, requested data is found in the EEDR 310. The EEPROM read access takes one instruction and there is no need to poll the EERE bit. When the EERE bit has been set, the CPU is halted for two cycles before the next instruction is executed.

An example of code for a block-before-write subroutine is shown, below.

```
// example of block-before write code
void eeWriteByte( uint16_t address, uint8_t data) {
    while(inb(IO_EESTATUS) & EEBUSY_FLAG) {
        nop( ); //   wait until busy goes away
    }
    outb(IO_EECR, EEWRITE_FLAG;   // set the EEPROM write bit
                                   in the control register
    outw (IO_EEAR, address);      // write the address to the EE
                                   address register
    outb(IO_EEDR, data);          // write the data to the EE
                                   data register
    outb(IO_EECR, 0);             // drop the write control line
                                   starting the write
}
```

FIG. 4 is a flow chart 400 for a block-before-write subroutine that has the computer wait until the EEPROM is clear before writing into the EEPROM. Block 402 detects setting of an EEPROM BUSY bit in the control register. Block 406 indicates that the computer waits until the EEPROM write is completed. Block 408 write an address to the EEPROM address register. Block 410 writes data into the EEPROM data register. Block 412 toggles a write control line to start writing data into the EEPROM at the specified EEPROM address.

FIG. 5 shows a READ DETECTOR circuit 500 that includes an EEPROM ADDRESS detector 502 that monitors addresses in the address space of the EEPROM in which a read is to be mapped. If such an address is found, a READ DETECT output signal is provided on a signal line 504 to one input terminal of a 2-input logic AND gate 506. The other input terminal of the 2-input logic AND gate 506 receives an EEPROM BUSY signal from the microcontroller 200 with the built-in EEPROM. If both the READ DETECT signal and the EEPROM BUSY signal are present at the same time, the AND gate 506 provides a WAIT signal on WAIT signal line 508 back to the processor in the microcontroller 200. Code execution and memory accesses can continue as long as they do not try to access the EEPROM. If any reads try to access the EEPROM, code execution is postponed via the wait mechanism, which is common to most processors.

The READ DETECTOR circuit 500 circuit in combination with the block-before-write code allows code optimization without being concerned with unanticipated EEPROM accesses. The result is that program code is able to continue execution in the processor until an EEPROM BUSY signal blocks execution. Write operations are blocked at the start of the block-before-write subroutine while reads are blocked by the additional READ detector circuit 500. Depending on the degree of code optimization, the present invention combination can eliminate some or all of the longs wait times by letting the EEPROM write while program code execution continues concurrently.

The present invention allows program code execution by the processor and memory accesses, other than to the EEPROM, by the processor to continue as long as the code execution by the processor and memory accesses by the processor do not try to access the EEPROM itself. If any read does try to access the EEPROM, the program code execution is postponed by means of a processor WAIT mechanism, which is common to most processors, miocrocomputers, or microcontrollers. The READ DETECTOR circuit 500 in combination with the block-before-write code allows code optimization without having to be concerned with unanticipated EEPROM accesses. The result is that code is able to continue execution in the processor until an EEPROM BUSY signal blocks execution of the code. For a busy EEPROM, write operations are blocked at the start of the subroutine, while read operations are blocked by the READ DETECTOR circuit 500.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention the various embodiments with various modifications as are suited to the particular use contemplated. It is intended that the scope of the invention be defined by the claims appended hereto and their equivalents.

What is claimed is:

1. A time-efficient read/write control method for an embedded EEPROM and processor, comprising:
   providing an EEPROM BUSY signal that is active when the EEPROM is engaged in a write activity;
   executing program code by the processor when the EEPROM BUSY signal is inactive;
   blocking write code execution by the processor at the start of a write subroutine when the EEPROM BUSY signal is active;
   blocking read code execution with a read detection circuit that detects when the EEPROM BUSY signal is active and when a read is requested for an EEPROM address; and
   continuing program code executing by the processor when the EEPROM BUSY signal is inactive, wherein the EEPROM BUSY signal blocks code execution such that write operations are blocked at the start of a write subroutine and such that read operations are blocked by the read detection circuit only when the read operations result in EEPROM read during an active EEPROM BUSY signal.

2. The method of claim 1 wherein blocking read code execution by using a read detection circuit that detects when the EEPROM BUSY signal is active and when a read is requested for an EEPROM address includes detecting a read address that is mapped into the EEPROM address space.

3. The method of claim 1 including allowing code execution by the processor and accesses by the processor to memory other than the EEPROM to continue as long as the EEPROM is not accessed by the processor and the EEPROM BUSY signal is inactive.

4. The method of claim 1 wherein providing an EEPROM BUSY signal from the EEPROM when the EEPROM is in a write activity includes providing the EEPROM BUSY signal as the state of a WRITE BUSY bit.

5. The method of claim 1 including embedding the EEPROM and processor together in an embedded system in a single integrated-circuit package.

6. A method, comprising:
   providing an EEPROM BUSY signal that is active when a EEPROM is engaged in a write activity;
   executing program code by a processor when the EEPROM BUSY signal is inactive;

blocking write code execution by the processor at the start of a write subroutine when the EEPROM BUSY signal is active;

blocking read code execution with a read detection circuit that detects when the EEPROM BUSY signal is active and when a read is requested for an EEPROM address; and continuing program code executing by the processor when the EEPROM BUSY signal is inactive, wherein the EEPROM BUSY signal blocks code execution such that write operations are blocked at the start of a write subroutine and such that read operations are blocked by the read detection circuit only when the read operations result in EEPROM read during an active EEPROM BUSY signal;

wherein blocking write code execution at the start of a write subroutine when the EEPROM BUSY signal is active includes:

detecting asserting of an EEPROM BUSY bit in a control register;

blocking code execution in the processor;

waiting until the EEPROM BUSY bit is deasserted;

writing an address to an EEPROM address register;

writing data into an EEPROM data register; and toggling a write control line to start writing data from the EEPROM data register into the EEPROM at the address written in the EEPROM address register.

7. A time-efficient control method for an embedded EEPROM and processor, comprising:

reading and writing the EEPROM with the processor;

asserting an EEPROM BUSY signal by the EEPROM when the EEPROM is in a write mode of operation;

using a block-before-write subroutine for the processor to suspend code execution by the processor if the EEPROM BUSY signal is asserted;

detecting a read address that is mapped into the EEPROM address space;

suspending code execution by the processor if a read address which is mapped into the address space of the EEPROM is detected and if the EEPROM BUSY signal is asserted; and allowing code execution by the processor and accesses by the processor to memory other than the EEPROM to continue as long as the EEPROM is not accessed by the processor and the EEPROM BUSY signal is not asserted.

8. The method of claim 7 wherein asserting the EEPROM BUSY signal by the EEPROM when the EEPROM is in a write mode of operation includes providing the EEPROM BUSY signal as the state of a WRITE BUSY bit.

9. The method of claim 7 wherein the EEPROM and processor are embedded in a single integrated-circuit package.

10. A method, comprising:

reading and writing a EEPROM with a processor;

asserting an EEPROM BUSY signal by the EEPROM when the EEPROM is in a write mode of operation;

using a block-before-write subroutine for the processor to suspend code execution by the processor if the EEPROM BUSY signal is asserted;

detecting a read address that is mapped into the EEPROM address space;

suspending code execution by the processor if a read address which is mapped into the address space of the EEPROM is detected and if the EEPROM BUSY signal is asserted; and allowing code execution by the processor and accesses by the processor to memory other than the EEPROM to continue as long as the EEPROM is not accessed by the processor and the EEPROM BUSY signal is not asserted;

wherein using a block-before-write subroutine for the processor to suspend code execution by the processor if the EEPROM BUSY signal is asserted includes:

detecting asserting of the EEPROM BUSY bit in a control register;

blocking code execution in the processor;

waiting until the EEPROM BUSY is deasserted;

writing an address to an EEPROM address register;

writing data into an EEPROM data register; and toggling a write control line to start writing data from the EEPROM data register into the EEPROM at the address written in the EEPROM address register.

11. An apparatus, comprising:

an EEPROM having at least one address register and configured to generate a memory busy signal when the EEPROM is in a write mode;

a logic AND gate having a first and second input, the first input coupled to the EEPROM and configured to receive the memory busy signal; and an address detector to monitor the address register, wherein if the address detector detects a read address present in address register, then a read signal is output to the first input of the logic AND gate; and wherein the logic AND gate receives both the read signal and the memory busy signal at the same time, and outputs a wait signal to a processor.

12. The apparatus of claim 11, wherein the EEPROM and the processor are embedded in a single integrated-circuit package.

13. The apparatus of claim 11, wherein the processor blocks the write code execution at the start of a write subroutine when the memory busy signal is active.

14. The apparatus of claim 13, wherein the processor blocks the write code execution upon detecting asserting of a memory EEPROM busy bit in a control register.

15. The apparatus of claim 14, wherein the processor provides blocking of the write code execution upon waiting until the EEPROM BUSY bit is deasserted, wherein blocking of the write code execution includes writing an address to an EEPROM address register, writing data into an EEPROM data register, and toggling a write control line to start writing data from the EEPROM data register into the EEPROM at the address written in the EEPROM address register.

16. A system comprising:

a EEPROM to assert an EEPROM BUSY signal when the EEPROM is in a write mode of operation;

a processor coupled to the EEPROM, the processor provided with a block-before-write subroutine to suspend code execution by the processor if the EEPROM BUSY signal is asserted;

an EEPROM address detector coupled to the EEPROM and the processor, the EEPROM address detector to detect a read address mapped into the EEPROM address space;

wherein the processor suspends code execution if both, a read address mapped into the address space of the EEPROM is detected and the EEPROM BUSY signal is asserted; and wherein the processor allows code execution as long as the EEPROM is not accessed by the processor and the EEPROM BUSY signal is not asserted.

17. The system of claim 16, wherein the processor allows a continuous execution of a program code as long as the processor does not try to access the EEPROM during the execution of the program code.

18. The system of claim 17, wherein the continuous execution of the program code is postponed by means of a processor WAIT mechanism, if a read command tries to access the EEPROM.

19. The system of claim 16, wherein the processor provides for access to memory other than the EEPROM to continue as long as the EEPROM is not accessed by the processor and the EEPROM BUSY signal is not asserted.

20. The system of claim 16, wherein the processor provides blocking of the write code execution upon waiting until the EEPROM BUSY bit is deasserted, wherein blocking of the write code execution includes writing an address to an EEPROM address register, writing data into an EEPROM data register, and toggling a write control line to start writing data from the EEPROM data register into the EEPROM at the address written in the EEPROM address register.

* * * * *

UNITED STATES PATENT AND TRADEMARK OFFICE
CERTIFICATE OF CORRECTION

PATENT NO. : 7,487,287 B2 Page 1 of 1
APPLICATION NO. : 11/349561
DATED : February 3, 2009
INVENTOR(S) : Melton It is certified that error appears in the above-identified patent and that said Letters Patent is hereby corrected as shown below:

In column 2, line 53, after "system" insert -- . --.

In column 3, line 17, delete "program-code" and insert -- program code --, therefor.

Signed and Sealed this

Thirtieth Day of June, 2009

JOHN DOLL
*Acting Director of the United States Patent and Trademark Office*